United States Patent [19]
Cha

[11] Patent Number: 5,881,004
[45] Date of Patent: Mar. 9, 1999

[54] BURN-IN STRESS CONTROL CIRCUIT FOR A SEMICONDUCTOR MEMORY DEVICE

[75] Inventor: Gi-won Cha, Suwon, Rep. of Korea

[73] Assignee: Samsung Electronics, Co., Ltd., Suwon, Rep. of Korea

[21] Appl. No.: 850,533

[22] Filed: May 2, 1997

[30] Foreign Application Priority Data

May 17, 1996 [KR] Rep. of Korea ...................... 96-16740

[51] Int. Cl.⁶ .................................................. G11C 7/00
[52] U.S. Cl. ......................................... 365/201; 365/191
[58] Field of Search .................................... 365/201, 226, 365/191; 371/21.1

[56] References Cited

U.S. PATENT DOCUMENTS 5,590,079 12/1996 Lee ........................................... 365/201
5,790,465  8/1998 Roh ........................................... 365/201

Primary Examiner—A. Zarabian
Attorney, Agent, or Firm—Marger, Johnson & McCollom, P.C.

[57] ABSTRACT

A burn-in stress control circuit for an integrated memory device, such as DRAM, includes a first logic gate for receiving a burn-in enable signal and outputting an inverted burn-in enable signal, a resistor having a first terminal connected to the input terminal of the first logic gate, a first capacitor connected between the second terminal of the resistor and ground. A first transistor having a control terminal connected to the second terminal of the resistor and a first main terminal connected to a source voltage, is activated only when the burn-in enable signal is a high logic signal, thereby outputting the source voltage to a second main terminal of the first transistor. A second transistor having a control terminal connected to an output terminal of the first logic gate, a first main terminal connected to ground and a second main terminal connected to the second main terminal of the first transistor, is activated only when the burn-in enable signal is a low logic signal. Thus, peak current applied to a memory cell array, and noise can be reduced.

5 Claims, 3 Drawing Sheets

BURN-IN STRESS CONTROL CIRCUIT FOR A SEMICONDUCTOR MEMORY DEVICE

BACKGROUND OF THE INVENTION

The present invention relates to a burn-in stress control circuit for a semiconductor memory device, and more particularly, to a control circuit that will limit the peak current generated in a semiconductor memory device while burn-in stress is being applied to the device.

During fabrication of a semiconductor memory device, the number of defects generated in a chip increases with the degree of integration of the chip. As the chip becomes more highly integrated, the size of each transistor on the chip is reduced. When the external supply voltage intended for the larger transistor is applied to the smaller transistor, stress associated with a strong electric field increases the failure rate of the transistor. Accordingly, in order to detect defects of the memory cells, and thereby ensure reliability of the chip, a burn-in stress is applied to the chip after fabrication of the chip. During the burn-in, a voltage higher than the external source voltage prescribed in the specification of the chip is applied to the chip for a long period of time at a high temperature, in order to detect a failed device when the chip is completed. By this method, the stress applied to each component or device of the chip increases, to detect initial failure.

FIG. 1 is a circuit diagram of a conventional DRAM semiconductor memory device. Referring to FIG. 1, the circuit includes: a plurality of word line drivers 11; word lines 15 connected to each of the word line drivers 11; a plurality of memory cells 13 connected to the word lines 15; and a row decoder 17 and a PX signal generator 19, both of which are connected to the word line drivers 11. Each of the word line drivers 11 is structurally the same—each comprises one PMOS transistor Q1 and two NMOS transistors Q2 and Q3. The sources of the PMOS transistors Q1 are connected to the PX signal generator 19 and the drains thereof are connected to the word lines 15. The drains of the NMOS transistors Q2 and Q3 are connected to the word lines 15, and their sources are connected to QUIET_VSS. The gates of the PMOS transistors Q1 and the NMOS transistor Q2 are connected to the row decoder 17, and the gates of the NMOS transistors Q3 are connected to the PX signal generator 19.

FIG. 2 is a schematic of a conventional burn-in stress control circuit that includes first and second NMOS transistors 21 and 23 having their drains connected together. An inverter 25 has an input terminal connected to the gate of the first NMOS transistor 21 and an output terminal connected to the gate of the second NMOS transistor 23. A wafer burn-in enable signal PWBE is connected to the gate of the first NMOS transistor 21. A word line drive voltage Vpp is applied from the row decoder 17 to the source of the first NMOS transistor 21 and the source of the second NMOS transistors 23 is connected to a ground potential terminal Vss.

Referring to the circuit shown in FIG. 2, a method of applying the burn-in stress to a memory cell transistor Q4 of FIG. 1 is described as follows. Here, only the word line driver 11 having the PMOS transistor Q1, the first NMOS transistor Q2 and the second NMOS transistor Q3, and a device Q4 connected thereto will be described. In a state of standby before the burn-in stress is applied or a read/write operation occurs, both a word line enable signal output from the row decoder 17 and a normal mode voltage output from the PX signal generator 19 have a high logic level. Consequently, the PMOS transistor Q1 is deactivated, and the first and second NMOS transistors Q2 and Q3 are activated, and thus the word line is electrically connected to a QUIET_VSS line.

When PWBE is a low logic signal, a fourth NMOS transistor 23 is activated, and thus the QUIET_VSS line is grounded through Vss. Accordingly, the memory cell transistor Q4 is deactivated, and thus the burn-in stress is not applied to the memory cell transistor Q4.

Next, when the circuit is in a burn-in mode for applying the burn-in stress, the PWBE is enabled, by applying a high logic signal thereto. Then, the third NMOS transistor 21 is activated and the fourth NMOS transistor 23 is deactivated, and thus a burn-in stress boltage (Vpp−Vt) is applied to the QUIET_VSS line. Here, Vt denotes threshold voltage of the third NMOS transistor 21. Since the first and second NMOS transistors Q2 and Q3 are activated, the burn-in stress voltage (Vpp−Vt) is transferred to the word lines 15. Accordingly, the memory cell transistor Q4 is activated by, and thus the burn-in stress is applied to the memory cell transistor Q4.

When the burn-in stress is completed after a predetermined period of time, PWBE is disabled, the third NMOS transistor 21 is deactivated, the fourth NMOS transistor 23 is activated, and thus the QUIET_VSS line and the word line are both grounded through Vss, thereby stopping the application of the burn-in stress to the memory cell transistor Q4.

In order to reduce the noise generated in the QUIET_VSS line, the resistance of the fourth NMOS transistor 23 is minimized by structurally enlarging its size. The third NMOS transistor 21 is also structurally enlarged, since the word line may come into contact with the bit line during the fabrication of the semiconductor, and when the PWBE is enabled, the QUIET_VSS line is electrically connected to the bit line, and thus, the voltage level of the QUIET_VSS line is reduced to (Vpp−Vt) or less.

When PWBE is changed to a low logic signal or a high logic signal, the voltage of each word line is changed to Vss or (Vpp−Vt). Here, since the third and fourth NMOS transistors 21 and 23 have a large structure, the peak currents thereof increase. Accordingly, the increased peak current causes an electro-migration phenomenon, which thereby causes a short of the QUIET_VSS line.

SUMMARY OF THE INVENTION

Accordingly, it is an object of the present invention to provide a burn-in stress control circuit for a semiconductor memory device in which the peak current of the device caused by the voltage applied thereto during burn-in can be reduced.

It is another object of the present invention to provide a burn-in stress control circuit for a semiconductor memory device which reduces the noise generated in the memory cell array during burn-in.

One aspect of the present invention, provides a burn-in stress control circuit in which peak current of the device is reduced. The circuit comprises: a first logic gate for receiving a burn-in enable signal and outputting an inverted burn-in enable signal; a resistor having a first terminal connected to the input terminal of the first logic gate; a first capacitor connected between the second terminal of the resistor and ground; a first transistor having a control terminal connected to the second terminal of the resistor and a first main terminal connected to a source voltage, and activated only when the burn-in enable signal is a high logic signal, thereby outputting the source voltage to a second main terminal of the first transistor; and a second transistor having a control terminal connected to an output terminal of the first logic gate, a first main terminal connected to ground and a second main terminal connected to the second main terminal of the first transistor, and activated only when the burn-in enable signal is a low logic signal.

Preferably, the first logic gate is an inverter and the first and second transistors are NMOS transistors. Also, it is preferable that a second capacitor connected is included between the output terminal of the first logic gate and ground.

A second aspect of the present invention, is a burn-in stress control circuit that reduces noise generated during burn-in. This circuit comprises: a first transistor having a control terminal connected to a burn-in enable signal, a first main terminal connected to a source voltage and a second main terminal connected to a node N, and activated only when the burn-in enable signal is a high logic signal, thereby outputting the source voltage to the node N; a second transistor having first and second main terminals connected to the first and second main terminals of the first transistor, respectively; a second logic gate having an input terminal connected to the control terminal of the first transistor for inverting the burn-in enable signal; a third transistor having a control terminal connected to an output terminal of the second logic gate, a first main terminal connected to the node N and a second main terminal connected to ground, and activated only when the burn-in enable signal is a low logic signal; a fourth transistor having first and second main terminals connected to the first and second main terminals of the third transistor; a third logic gate having a first input connected to the node N, a second input terminal connected to the control terminal of the first transistor and an output terminal connected to the control terminal of the fourth transistor for activating the fourth transistor only when the node N and the burn-in enable signal are both a low logic signal; and fourth logic gate having a first input terminal connected to the first input terminal of the third logic gate, a second input terminal connected to the second input terminal of the third logic gate and an output terminal connected to the control terminal of the second transistor, for activating the second transistor only when the node N and the burn-in enable signal are both a high logic signal.

Preferably, the first, second, third and fourth transistors are NMOS transistors.

It is preferable that the second logic gate is an inverter and the third logic gate is a NOR gate.

It is also preferable that the fourth logic gate comprises a NAND gate having input terminals connected to the input terminals of the third logic gate and an inverter having an input terminal connected to an output terminal of the NAND gate and an output terminal connected to the control terminal of the second transistor.

According to the present invention, peak current applied to the memory cell array and noise can be reduced.

BRIEF DESCRIPTION OF THE DRAWINGS

The features, objects, and advantages of the present invention will become more apparent by describing in detail a preferred embodiment thereof with reference to the attached drawings in which.

DETAILED DESCRIPTION

Figure 3:
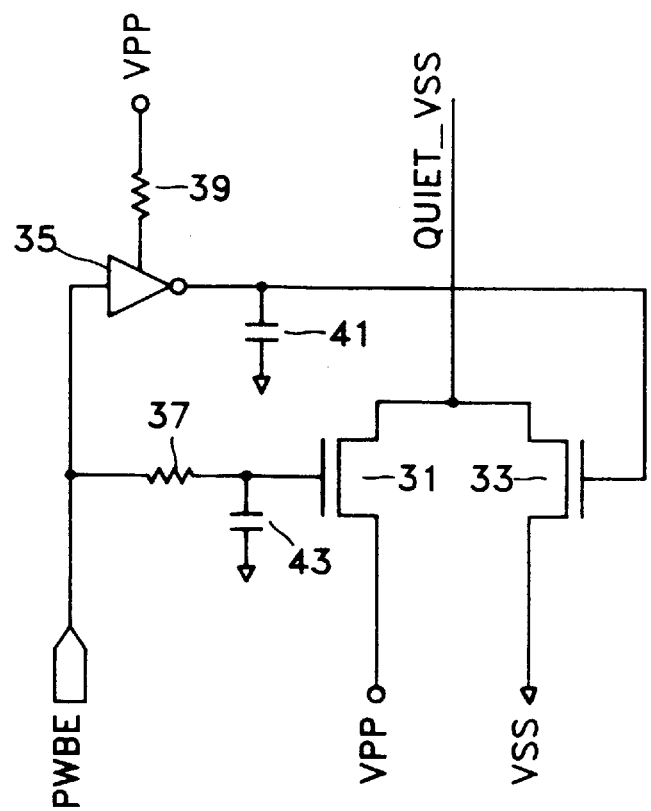
FIG. 3 is a schematic of a burn-in stress control circuit according to a first embodiment of the invention.

The circuit of FIG. 3 includes an inverter 35 for inverting a burn-in enable signal PWBE. A first resistor 37 has one of its terminals connected to the input terminal of the inverter 35 to receive signal PWBE. A first NMOS transistor 31 has a gate connected to the other end of the first resistor 37 and a drain connected to a QUIET_VSS line of the word line driver 11 of FIG. 1, thereby supplying a word line driving voltage to the word line driver 11 of FIG. 1, when activated. A first capacitor 43 is connected between the second terminal of the first resistor 37 and ground in order to slow the increase of the voltage applied to the gate of a first NMOS transistor 31. A second NMOS transistor 33 has a drain connected to the drain of the first NMOS transistor 31 and a gate connected to the output terminal of the inverter 35, thereby grounding the word line driver 11 of FIG. 1, when activated. The word line drive voltage Vpp is coupled to the source of the first NMOS transistor 31; and a ground potential terminal Vss is coupled to the source of the second NMOS transistor 33 is connected.

Figure 1:
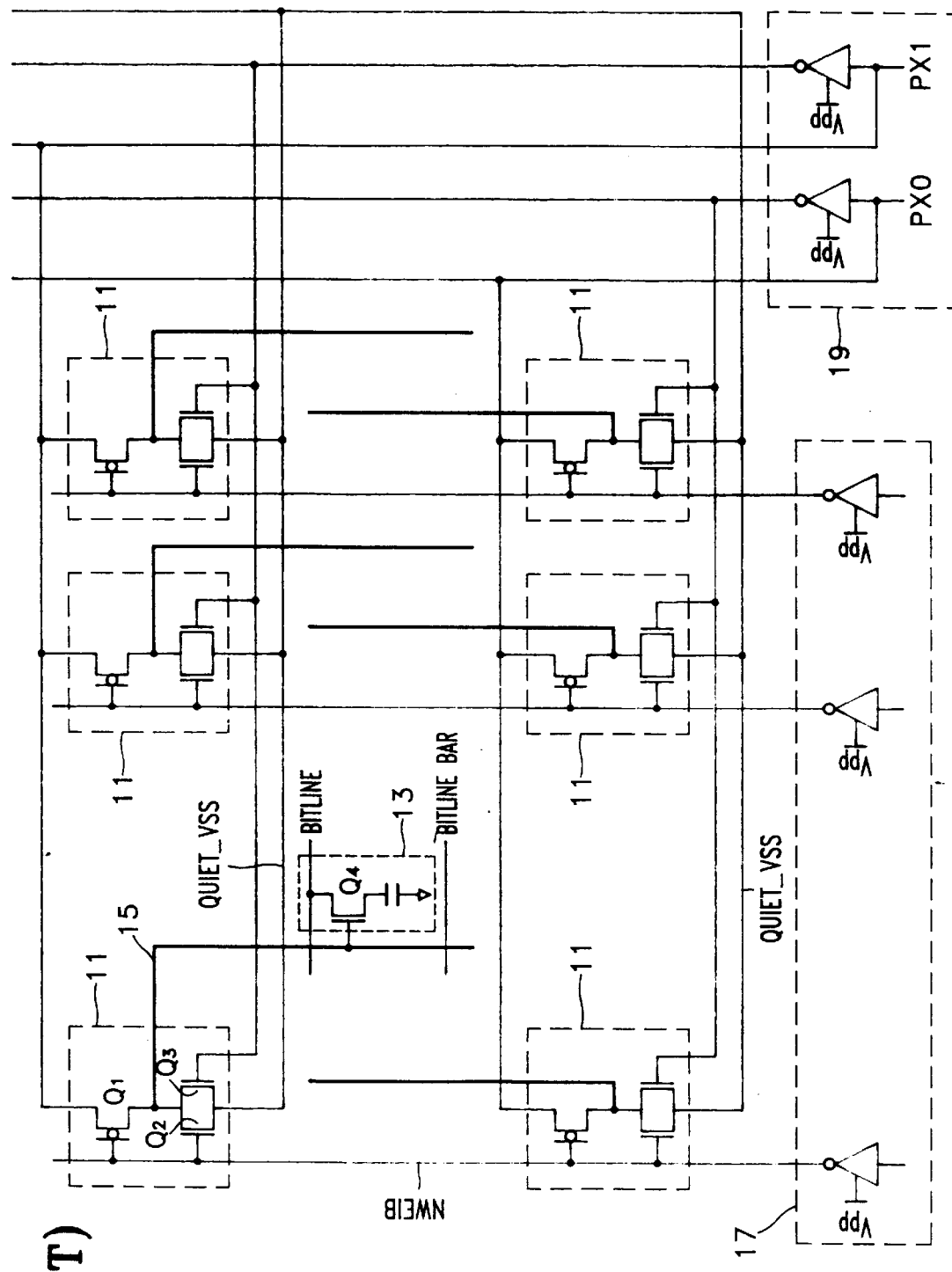
FIG. 1 is a general circuit diagram of a conventional DRAM semiconductor device.
Figure 2:
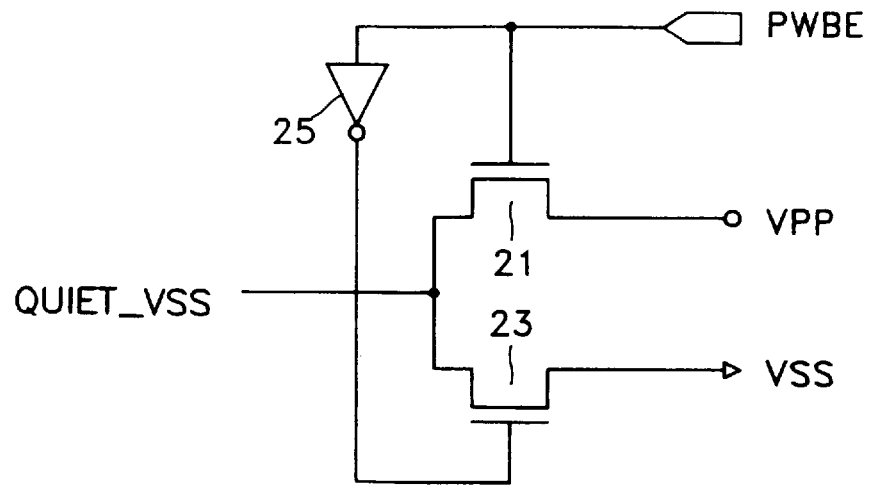
FIG. 2 is a schematic of a conventional burn-in stress control circuit for a semiconductor memory device.

When the circuit of FIG. 3 is in its standby mode, PWBE is a low logic signal, the first NMOS transistor 31 is deactivated, and the second NMOS transistor 33 is activated, and thus the QUIET_VSS line of FIG. 1 is grounded through Vss. When the circuit is in its burn-in mode, PWBE is a high logic signal, the first NMOS transistor 31 is activated and the second NMOS transistor 33 is deactivated, and thus the burn-in stress voltage (Vpp−Vt) is applied to the QUIET_VSS line. Accordingly, the burn-in stress is applied to the memory cell transistor Q4 of FIG. 1.

In order to reset the circuit from its burn-in mode to its standby mode, PWBE is changed from a high logic signal to a low logic signal.

In FIG. 3, when the logic level of PWBE is changed, the magnitude of the time rate of change of the voltage applied to the gate of the first NMOS transistor 31 is small due to the first resistor 37 and the first capacitor 43. Thus, the peak current applied to the QUIET_VSS line is reduced, and since PWBE during a read/write operation is always a low logic signal, the second NMOS transistor 33 is activated. Furthermore, since the resistance of the second NMOS transistor 33 is small, when it is activated, noise on the QUIET_VSS line is reduced.

Figure 4:
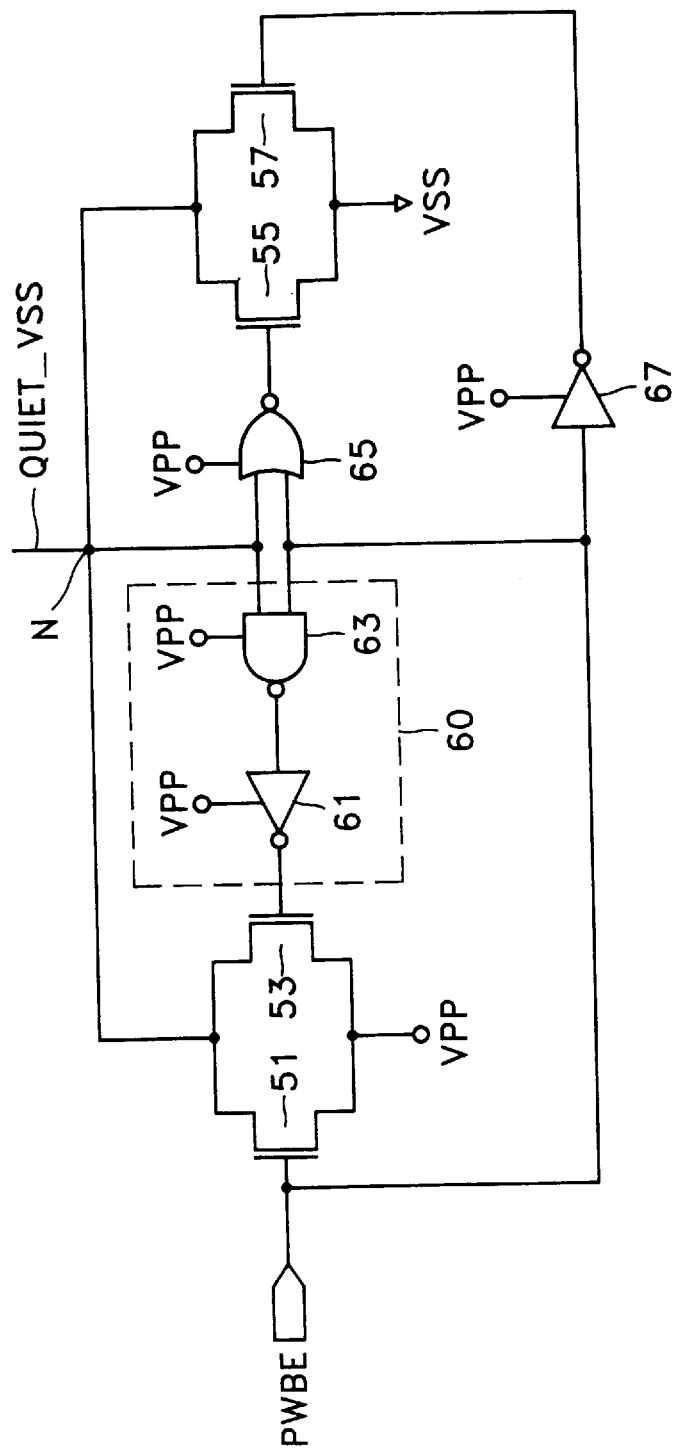
FIG. 4 is a schematic of a burn-in stress control circuit according to a second embodiment of the invention.

Referring to FIG. 4, the circuit includes a first NMOS transistor 51 having its gate connected to a burn-in enable signal PWBE, its source connected to word line drive voltage Vpp, and its drain connected to the QUIET_VSS line. The QUIET_VSS line in turn is connected to the word line driver of a memory cell (e.g. line 15 in FIG. 1), thereby supplying the word line drive voltage Vpp to the QUIET_VSS line when the first NMOS transistor 51 is activated. A second NMOS transistor 53 has its drain connected to the QUIET_VSS line, thereby supplying the word line drive voltage Vpp to the QUIET_VSS line when the second NMOS transistor 53 is activated. A word line drive voltage Vpp input terminal is connected to the sources of the first and second NMOS transistors 51 and 53. A third NMOS transistor 55 has its drain connected to the QUIET_VSS line, thereby grounding the QUIET_VSS line through Vss when the third NMOS transistor 55 is activated. A fourth NMOS transistor 57 has its drain connected to the QUIET_

VSS line, thereby grounding the QUIET_VSS line through Vss when the fourth NMOS transistor 57 is activated. A logic device 60 has a first input terminal connected to the QUIET_VSS line (node N), a second input terminal connected to PWBE, and an output terminal connected to the gate of the second NMOS transistor 53 for activating and deactivating the second NMOS transistor 53. A NOR gate 65 has a first input terminal connected to the QUIET_VSS line (node N), a second input terminal connected to PWBE, and an output terminal connected to the gate of the third NMOS transistor 55 for activating and deactivating the third NMOS transistor 55. A first inverter 67 has its input terminal connected to the input terminal of the first NMOS transistor 51 and to the PWBE, as well as to the second input terminals of the logic 60 and the NOR gate 65. Inverter 67 has its output terminal connected to the gate of the fourth NMOS transistor 57, thereby supplying the inverted burn-in enable signal to the fourth NMOS transistor 57. The logic device 60 preferably includes a second inverter 61 having an output terminal connected to the gate of the second NMOS transistor 53 and an input coupled to the output of a NAND gate 63 having inputs connected to the first and second input terminals of the NOR gate 65.

When the circuit of FIG. 4 is in its standby mode, PWBE is a low logic signal, the first and second NMOS transistors 51 and 53 are deactivated, the fourth NMOS transistor 57 is activated, and thus the QUIET_VSS line is grounded, thereby activating the third NMOS transistor 55. When the circuit of FIG. 4 is in its burn-in mode, PWBE is a high logic signal, the first and second NMOS transistors 51 and 53 are activated, the third and fourth NMOS transistors 55 and 57 are deactivated, and thus the burn-in stress voltage (Vpp−Vt) is applied to the QUIET_VSS line, to thereby apply the burn-in stress to the memory cell transistor Q4 of FIG. 1.

In order to reset the circuit from its burn-in mode to its standby mode, PWBE is changed from a high logic signal to a low logic signal.

In FIG. 4, when PWBE changes from a low logic signal to high logic signal, initially, only the first NMOS transistor 51 is activated. Thus, the QUIET_VSS line receives a high logic signal due to the change in the first NMOS transistor 51. Then, when the second NMOS transistor 53 is activated, a voltage Vds, occurring between the sources and drains of the first and second NMOS transistors 51 and 53, decreases, thereby the peak current applied to the QUIET_VSS line is decreased. Also, when PWBE changes from a high logic signal to a low logic signal, initially, only the fourth NMOS transistor 57 is activated, and thus the QUIET_VSS line is grounded through Vss. consequently, the third NMOS transistor 55 is activated, to thereby lower the peak current.

Since PWBE is a low logic signal during a read/write operation, the third and fourth NMOS transistors 55 and 57 are activated, thus reducing the resistance of the third and fourth NMOS transistors 55 and 57, which in turn reduces noise on the QUIET_VSS line.

According to the present invention, the peak current applied to the memory cell array during the burn-in is reduced, and noise applied to the memory cell array during a read/write operation is also reduced.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed:

1. A burn-in stress control circuit comprising:
   a first logic gate for receiving a burn-in enable signal and outputting an inverted burn-in enable signal;
   a resistor having a first terminal connected to the input terminal of said first logic gate;
   a first capacitor connected between the second terminal of said resistor and ground;
   a first transistor having a control terminal connected to the second terminal of said resistor and a first main terminal connected to a source voltage, and activated only when said burn-in enable signal is a high logic signal, thereby outputting said source voltage to a second main terminal of said first transistor; and
   a second transistor having a control terminal connected to an output terminal of said first logic gate, a first main terminal connected to ground and a second main terminal connected to the second main terminal of said first transistor, and activated only when said burn-in enable signal is a low logic signal.

2. A burn-in stress control circuit according to claim 1, wherein said first logic gate is an inverter.

3. A burn-in stress control circuit according to claim 1, wherein said first and second transistors are NMOS transistors.

4. A burn-in stress control circuit according to claim 1, further comprising a second capacitor connected between the output terminal of said first logic gate and ground.

5. A burn-in stress control circuit according to claim 1 in which the resistor and first capacitor are sized to limit a peak current though the first and second transistors to the second main terminal.

* * * * *